(12) United States Patent
Kai et al.

(10) Patent No.: US 11,476,748 B2
(45) Date of Patent: Oct. 18, 2022

(54) METHOD FOR CONTROLLING RESONANT POWER CONVERSION DEVICE, AND RESONANT POWER CONVERSION DEVICE

(71) Applicant: NISSAN MOTOR CO., LTD., Yokohama (JP)

(72) Inventors: Toshihiro Kai, Kanagawa (JP); Kousuke Saito, Kanagawa (JP); Shigeharu Yamagami, Kanagawa (JP); Keisuke Inoue, Kanagawa (JP); Kraisorn Throngnumchai, Kanagawa (JP)

(73) Assignee: NISSAN MOTOR CO., LTD., Yokohama (JP)

( * ) Notice: Subject to any disclaimer, the term of this patent is extended or adjusted under 35 U.S.C. 154(b) by 0 days.

(21) Appl. No.: 17/048,685

(22) PCT Filed: Apr. 20, 2018

(86) PCT No.: PCT/IB2018/000570
§ 371 (c)(1),
(2) Date: Oct. 19, 2020

(87) PCT Pub. No.: WO2019/202354
PCT Pub. Date: Oct. 24, 2019

(65) Prior Publication Data
US 2021/0159773 A1 May 27, 2021

(51) Int. Cl.
*H02M 1/08* (2006.01)
*H02M 1/32* (2007.01)
(Continued)

(52) U.S. Cl.
CPC ............... *H02M 1/08* (2013.01); *H02M 1/32* (2013.01); *H02M 7/537* (2013.01); *H02M 1/0058* (2021.05)

(58) Field of Classification Search
CPC .. H02J 7/00; H02J 7/022; H02M 1/00; H02M 1/0058; H02M 1/08; H02M 1/32;
(Continued)

(56) References Cited

U.S. PATENT DOCUMENTS 9,024,691 B2   5/2015  Banerjee et al.
2001/0019490 A1*  9/2001  Igarashi ............... H02M 3/335
                                                    363/19

(Continued)

FOREIGN PATENT DOCUMENTS

JP        2011-101408 A      5/2011

*Primary Examiner* — Menatoallah Youssef
*Assistant Examiner* — Dave Mattison
(74) *Attorney, Agent, or Firm* — Foley & Lardner LLP

(57) ABSTRACT

A method for controlling a resonance type power converter including a first resonance circuit ($L_0$, $C_0$) and a shunt circuit (3), which converts and outputs the power of the DC power supply, shunting a current flowing into a first capacitor ($C_S$) by controlling a second switching element ($S_2$) during a predetermined period within turn-off period of a first switching element ($S_1$), the first capacitor connected in parallel to the first switching element ($S_1$), the second switching element ($S_2$) included in the shunt circuit (3), and the first switching element ($S_1$) operated in response to the resonance of the first resonance circuit ($L_0$, $C_0$).

13 Claims, 12 Drawing Sheets

(51) Int. Cl.
*H02M 7/537* (2006.01)
*H02M 1/00* (2006.01)

(58) Field of Classification Search
CPC .... H02M 1/342; H02M 3/33523; H02M 7/00; H02M 7/003; H02M 7/48; H02M 7/4815; H02M 7/537; H03F 3/00; H03F 3/2176; Y02B 70/00; Y02B 70/10; Y02B 70/1441
USPC .......................................................... 363/131
See application file for complete search history.

(56) References Cited

U.S. PATENT DOCUMENTS

| | | |
|---|---|---|
| 2002/0101284 A1 | 8/2002 | Kee et al. |
| 2004/0113689 A1 | 6/2004 | Hajimiri et al. |
| 2017/0085189 A1* | 3/2017 | Madsen ............ H02M 3/33546 |

* cited by examiner

METHOD FOR CONTROLLING RESONANT POWER CONVERSION DEVICE, AND RESONANT POWER CONVERSION DEVICE

TECHNICAL FIELD

The present invention relates to a method of controlling a resonance type power converter and a resonance type power converter.

BACKGROUND ART

In order to reduce the applied voltage to switching element constituting a class E circuit, a class E/F circuit comprising the class E circuit, and a resonance circuit for superimposing harmonics of an integer multiple of the operating frequency during soft switching operation is known with (Patent Document 1: JP 2011-101408 A).

PRIOR ART DOCUMENT

Patent Document

[Patent Document 1] JP 2011-101408 A

SUMMARY OF INVENTION

Problems to be Solved by Invention

In the prior art, there is a problem that since the harmonics of the integer multiple of the operating frequency are superimposed by the resonance circuit, the switching loss is increased as compared with a resonance type power converter using only the class E circuit.

An problem to be solved by the present invention is to provide a method for controlling a resonance type power converter and a resonance type power converter that can reduce the switching loss generated during the soft switching operation.

Means for Solving Problems

The present invention solves the above problems by shutting a current flowing into a first capacitor connected in parallel to a first switching element by controlling a second switching element included in a shunt circuit, during a predetermined period within turn-off period of the first switching element which operates in response to resonance of the first resonance circuit.

Effect of Invention

According to the present invention, it is possible to reduce the switching loss generated during the soft switching operation.

MODE(S) FOR CARRYING OUT THE INVENTION

Hereinafter, embodiments of the present invention will be described with reference to the drawings.

First Embodiment

Figure 1:
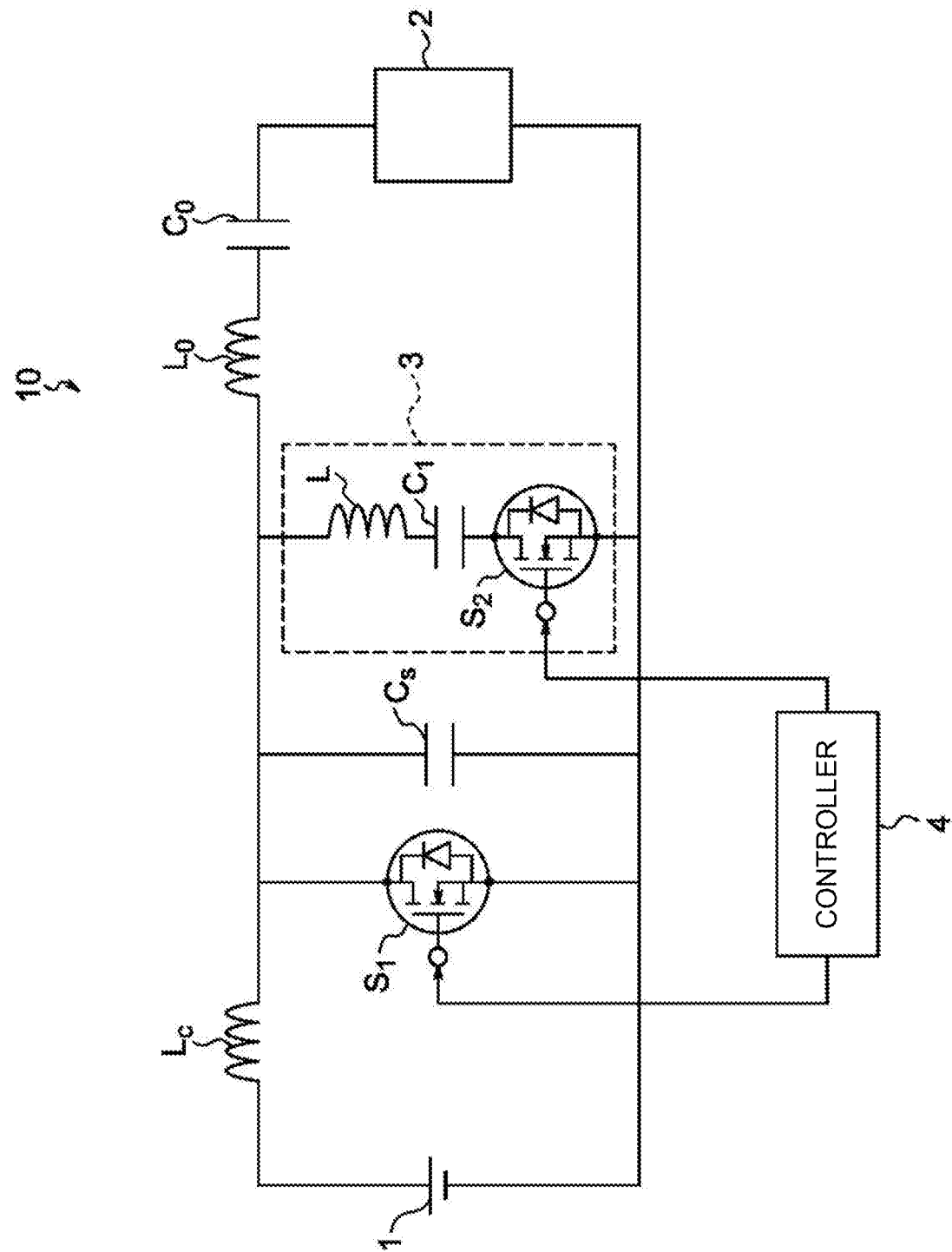
FIG. 1 is a configuration diagram of a power conversion system comprising a resonance type power converter according to a first embodiment.

FIG. 1 is a diagram illustrating a configuration of a power conversion system comprising a resonance type power converter according to a first embodiment. A power conversion system 10 according to the first embodiment is utilized in a hybrid vehicle capable of traveling a motor as a driving source and an electric vehicle for traveling a motor as a driving source, or the like. Note that there is no particular limitation on a situation in which the power conversion system 10 is used.

As shown in FIG. 1, the power conversion system 10 is a system in which the DC power of an input voltage source 1 is converted and supplied to the load 2 by the resonance type power converter according to the present embodiment. The resonance type power converter of the present embodiment is an inverter, and controls output power according to the state of supplying power to the load 2.

The input voltage source 1 generates and outputs DC power. For example, in the input voltage source 1, an AC voltage input from the commercial power supply (e.g., 200V) is rectified by a rectifier circuit (not shown), and smoothed by a smoothing circuit (not shown), so that the AC voltage is converted to a DC voltage. Then, DC-DC converter (not shown) converts to a DC voltage of a predetermined target voltage. Incidentally, the configuration of the input voltage source 1 is not limited, it may be those for outputting a predetermined DC voltage.

A inverter converts the DC voltage input from the input source 1 into an AC voltage. The inverter comprises an input coil $L_c$ a first switching element $S_1$, a shunt capacitor $C_s$, a series resonance circuit configured with a coil $L_0$ and a capacitor $C_0$, and a shunt circuit 3. The inverter is a so-called class E inverter capable of class E operation.

The input coil $L_c$ is connected series between a high-potential output terminal of the input voltage source 1 and the first switching element $S_1$. Specifically, one end of the input coil $L_c$ is connected to the input voltage source 1, and the other end of the input coil $L_c$ is connected to the first switching element $S_1$. The input coil $L_c$ supplies a constant current to the first switching element $S_1$, when the input voltage source 1 outputs a constant DC voltage. The input coil $L_c$ is a so-called choke coil.

The first switching element $S_1$ switches between an on-state and an off-state in accordance with a control signal input from the controller 4. The first switching element $S_1$ switches from the off-state to the on-state, when the first switching element $S_1$ is turned on. Conversely, the first switching element $S_1$ switches from the on-state to the off state, when the first switching element $S_1$ is turned off.

The first switching element $S_1$ will be described as an MOSFET (Metal Oxide Semiconductor Field Effect Transistor) in the present embodiment, but the first switching element $S_1$ is not specifically limited. The first switching element $S_1$ may be, for example, a bipolar transistor capable of being controlled by a current, an IGBT (Insulated Gate Bipolar Transistor) capable of being controlled by a voltage, or the like. A drain terminal of the first switching element $S_1$ is connected to the other end of the input coil $L_c$. A source terminal of the first switching element $S_1$ is connected to a low-potential side output terminal of the input voltage source 1.

The control signal is input from the controller 4 to a gate terminal of the first switching element $S_1$. The control signal is a pulse signal repeating high-level and low-level at a predetermined frequency. The predetermined frequency is a frequency at which the first switching element $S_1$ is switched, in the following, also referred to as a switching frequency $f_s$. When the control signal changes from high-level to low-level, the first switching element $S_1$ is turned off, and when the control signal changes from a low-level to high-level, the first switching element $S_1$ is turned on.

The first switching element $S_1$ has a diode inside the device. As shown in FIG. 1, an anode terminal of the diode is connected to the source terminal of the first switching element $S_1$, and a cathode terminal of the diode is connected to the drain terminal of the first switching element $S_1$. Such a diode can protect the first switching element $S_1$ from inverse electromotive force generated by the first switching element $S_1$ switching.

The shunt capacitor $C_s$ is connected to the first switching element $S_1$ in parallel. A current flow int to the shunt capacitor $C_s$ during the off-state of the first switching element $S_1$. The shunt capacitor $C_s$ is a capacitor for storing electric energies. After a voltage across the shunt capacitor $C_s$ reach peaks, the shunt capacitor discharges to release electric energies. When the voltage across the shunt capacitor $C_s$ becomes zero, the first switching element $S_1$ is switched from the off-state to the on-state. The first switching element $S_1$ control by the controller 4 will be described later.

The coil $L_0$ and capacitor $C_0$ are designed such that the resonance frequency matches the switching frequency $f_s$, and the coil $L_0$ and capacitor $C_0$ comprise a series resonance circuit. One end of the coil $L_0$ is connected to the drain terminal of the first switching element $S_1$ and to the other end of the input coil $L_c$. The other end of the coil $L_0$ is connected to one end of the capacitor $C_0$. The other end of the capacitor $C_0$ is connected to the load 2, which will be described later. In the following, for convenience of explanation, the series resonance circuit configured with the coil $L_0$ and the capacitor $C_0$ will be referred to as a first resonance circuit. Due to the resonance characteristics of the first resonance circuit, the output voltage of the inverter is a voltage that oscillates at resonance frequency (the switching frequency $f_s$) along a sine wave.

The load 2 is provided on the output side of the inverter. The load 2 may be, for example, a motor, a battery comprised of a secondary battery, or the like. If the load 2 is a battery, the battery is connected to the inverter via a rectifier. In the present embodiment, the type of the load 2 is not particularly limited.

The shunt circuit 3 is connected in parallel to the shunt capacitor $C_s$ to shunt the current flowing into the shunt capacitor $C_s$. In the present embodiment, the shunt circuit 3 is configured with the series resonance circuit of a coil L and a capacitor $C_1$ and a second switching element $S_2$ connected in series to the series resonance circuit. One end of the coil L is connected to the other end of the input coil $L_c$, and the other end of the coil L is connected to one end of the capacitor $C_1$. In the following, for convenience of explanation, the series resonance circuit configured with the coil L and the capacitor $C_1$ will be described as a second resonance circuit. Incidentally, shunting the current flowing into the shunt capacitor $C_s$ means that it makes the current to flow separately from the main current, when the current flowing into the shunt capacitor $C_s$ is regarded as the main current. In the following description, for convenience of explanation, a shunt current includes the current itself of the main current flowing in another direction without being divided from the main current.

The second switching element $S_2$ switches between an on-state and an off-state in accordance with a control signal input from the controller 4. The second switching element $S_2$ switches from the off-state to the on-state, when the second switching element $S_2$ is turned on. Conversely, the second switching element $S_2$ switches from the on-state to the off-state, the second switching element $S_2$ is turned off.

In this embodiment, the second switching element $S_2$ will be described as a MOSFET, like the first switching element $S_1$, but second switching element $S_2$ is not specifically limited. The second switching element $S_2$ may be, for example, a bipolar transistor capable of being controlled by a current, an IGBT (Insulated Gate Bipolar Transistor) capable of being controlled by a voltage, or the like. A drain terminal of the second switching element $S_2$ is connected to the other end of the coil L. A source terminal of the second switching element $S_2$ is connected to a low-potential side output terminal of the input voltage source 1.

In this embodiment, the second switching element $S_2$ is arranged so that potential of the source terminal of the second switching element $S_2$ is the same as potential of the source terminal of the first switching element $S_1$. This reduces influence of noise on the second switching element $S_2$. The arrangement relation between the second switching element $S_2$ and the second resonance circuit is not particularly limited. For example, unlike FIG. 1, the second switching element $S_2$ may be arranged at high potential side of the input voltage source 1 than the second resonance circuit.

The control signal is input from the controller 4 to a gate terminal of the second switching element $S_2$. The control signal becomes high-level at a predetermined timing in accordance with the state of the first switching $S_1$. Thereafter, the control signal becomes low-level after a predetermined period has elapsed in accordance with the state of the first switching element $S_1$. When the control signal changes from high-level to low-level, the second switching element $S_2$ is turned off, and when the control signal changes from low-level to high-level, the second switching element $S_2$ is turned on. The control signal is switched to high-level or low-level in accordance with timing the first switching element $S_1$ is turned off or turned on. The second switching element $S_2$ control by the controller 4 will be described later.

The second switching element $S_2$ has a diode inside the device. As shown in FIG. 1, an anode terminal of the diode is connected to the source terminal of the second switching element $S_2$, and a cathode terminal of the diode is connected to the drain terminal of the second switching element $S_2$.

The controller 4 is configured with a microcomputer having a CPU (Central Processing Unit), a ROM (Read Only Memory), and a RAM (Random Access Memory), or a FPGA (Field Programmable Gate Array).

The controller 4 controls output power of the inverter by controlling the first switching element $S_1$ of the inverter. In addition, the controller 4 controls the second switching element $S_2$ to shunt the current flowing into the shunt capacitor $C_s$ and causes the current to flow into the shunt circuit 3.

First, the control of the first switching element $S_1$ by the controller 4 will be described. The controller 4 generates a control signal for turning on and off the first switching element $S_1$, and outputs it to the gate terminal of the first switching element $S_1$. For example, the controller 4 generates a pulse signal having the switching frequency $f_s$ based on a reference clock. The controller 4 amplifies the pulse signal to a level at which the first switching element $S_1$ can be driven by a drive circuit (not shown) and outputs the amplified pulse signal as a control signal to the gate terminal of the first switching element $S_1$. This causes the first switching element $S_1$ to repeat turn-on or turn-off.

In addition, to control the first switching element $S_1$, a detection value is input to the controller 4 from a current sensor (not shown) for detecting the output current of the first switching element $S_1$. The controller 4 performs feedback control based on the output current value. For example, the controller 4 changes or adjusts frequency and duty ratio of the control signal based on the output current value. As a result, the switching frequency $f_s$ and the duty ratio of the first switching element $S_1$ are changed, and the output power of the inverter can be controlled. Incidentally, the duty ratio is a value indicating the ratio of the on-period to a unit period when total period of on-period and off-period of the first switching element $S_1$ is the unit period.

In addition, the controller 4 generates a control signal for turning on the first switching element $S_1$ when the voltage applied across the drain terminal and the source terminal of the first switching element $S_1$ is zero. Generally, in first switching element $S_1$, an on-resistance exists between the drain terminal and the source terminal due to the inner structures. For example, when a switching element is turned on while a predetermined voltage is applied across both terminals of the switching element, power consumption based on the voltage across both terminals and the on-resistance of the switching element is generated, thereby lowering the power conversion efficiency of the inverter (also referred to as switching loss).

In the inverter having the first resonance circuit configured with the coil $L_0$ and the capacitor $C_0$ as in the present embodiment, the resonant characteristics of resonance circuit cause the voltage applied across the drain terminal and the source terminal of the first switching element $S_1$ to be a voltage that varies with time along a sine wave. Therefore, for example, when the first switching element $S_1$ is turned on while the voltage across the drain terminal and the source terminal is zero voltage, the power consumed by the first switching element $S_1$ is significantly reduced, and the power conversion efficiency of the inverter can be improved. In the following description, for convenience of explanation, the operation of such the first switching element $S_1$ is referred to as ZVS (Zero Voltage Switching), zero-voltage switching, or soft-switching. The operation of ZVS or the like includes an operation in which the first switching element $S_1$ is turned off when the voltage across the drain terminal and the source terminal is zero voltage.

Next, the control of the second switching element $S_2$ by the controller 4 will be described. The controller 4 generates a control signal for turning on and off the second switching element $S_2$, and outputs it to the gate terminal of the second switching element $S_2$. When generating the control signal of the second switching element $S_2$, the controller 4 amplifies the control signal to a level at which the second switching element $S_2$ can be driven by the drive circuit, like the first switching element $S_1$ control.

The timing to turn on or off the second switching element $S_2$ and the turn-on period of the second switching element $S_2$ will be described with reference to FIG. 2.

Figure 2:
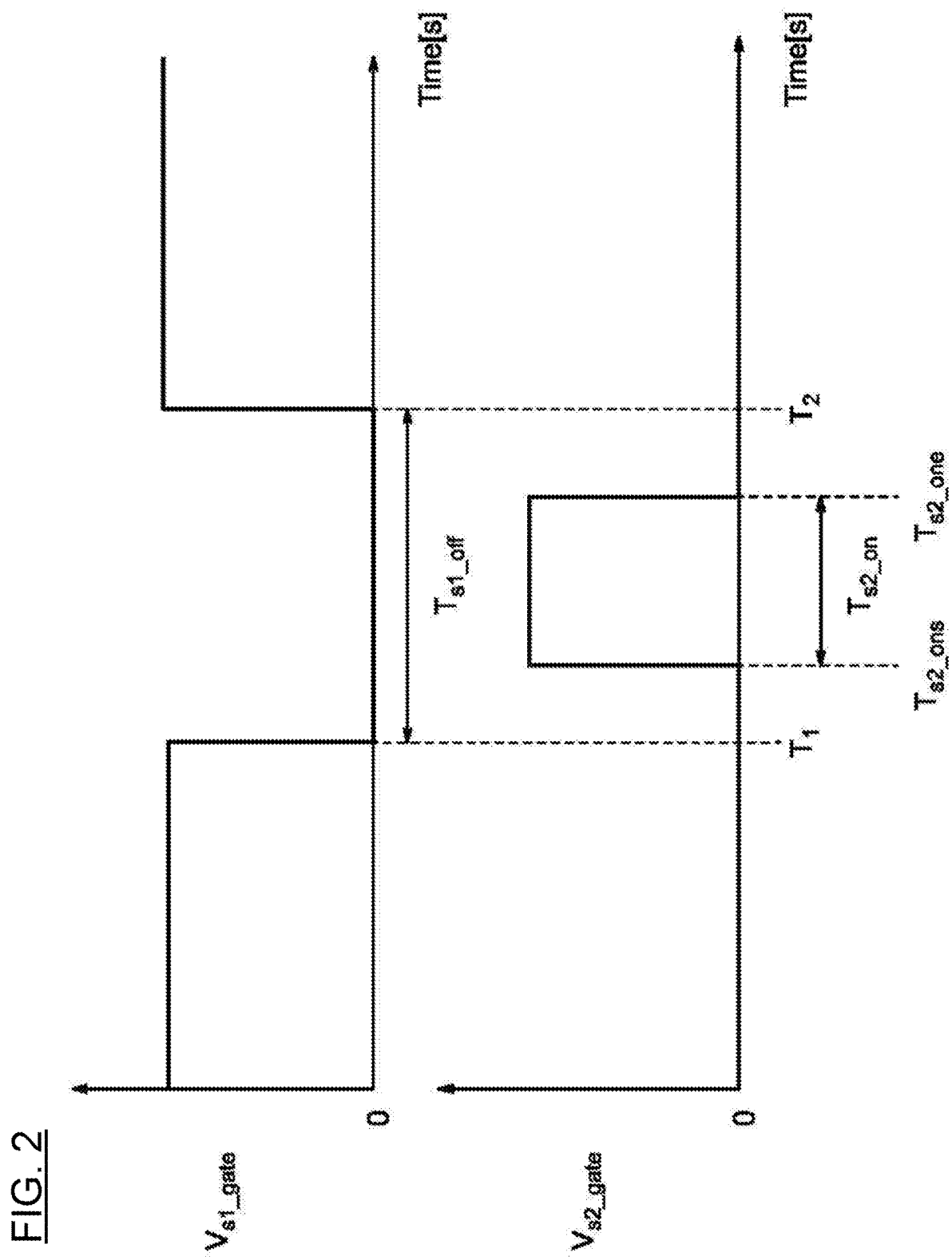
FIG. 2 is a diagram for explaining a control signal to a second switching element according to the first embodiment.

FIG. 2 is a diagram for explaining the control signal to the second switching element $S_2$. In FIG. 2, the upper graph shows the control signal to the first switching element $S_1$ and the lower graph shows the control signal to the second switching element $S_2$.

As shown in FIG. 2, the controller 4 controls the second switching element $S_2$ while the control signal to the first switching element $S_1$ is low-level. The controller 4 turns on the second switching element $S_2$ for a predetermined period within turn-off period of the first switching element $S_1$. The controller 4 then turns off the second switching element $S_2$ after a predetermined time. Specifically, the controller 4 turns on the second switching element $S_2$ later than the first switching element $S_1$ is turned off. When the second switching element $S_2$ is on, the controller 4 turns off the second switching element $S_2$ earlier than the first switching element $S_1$ is turned on. This allows current flowing into the shunt capacitor $C_s$ to be shunted during turn-off period of the first switching element $S_1$.

In the example of FIG. 2, the controller 4 turns off the first switching element $S_1$ (time $T_1$) and turns on the second switching element $S_2$ (time $T_{s2\_ons}$) after a predetermined time has elapsed. The controller 4 then turns on the second switching element $S_2$ during the turn-on period $T_{s2\_on}$, and then turns off the second switching element $S_2$ (time Ts2_one). When control to the second switching element $S_2$ is completed, the controller 4 turns on the first switching element $S_1$ (time $T_2$).

Figure 3:
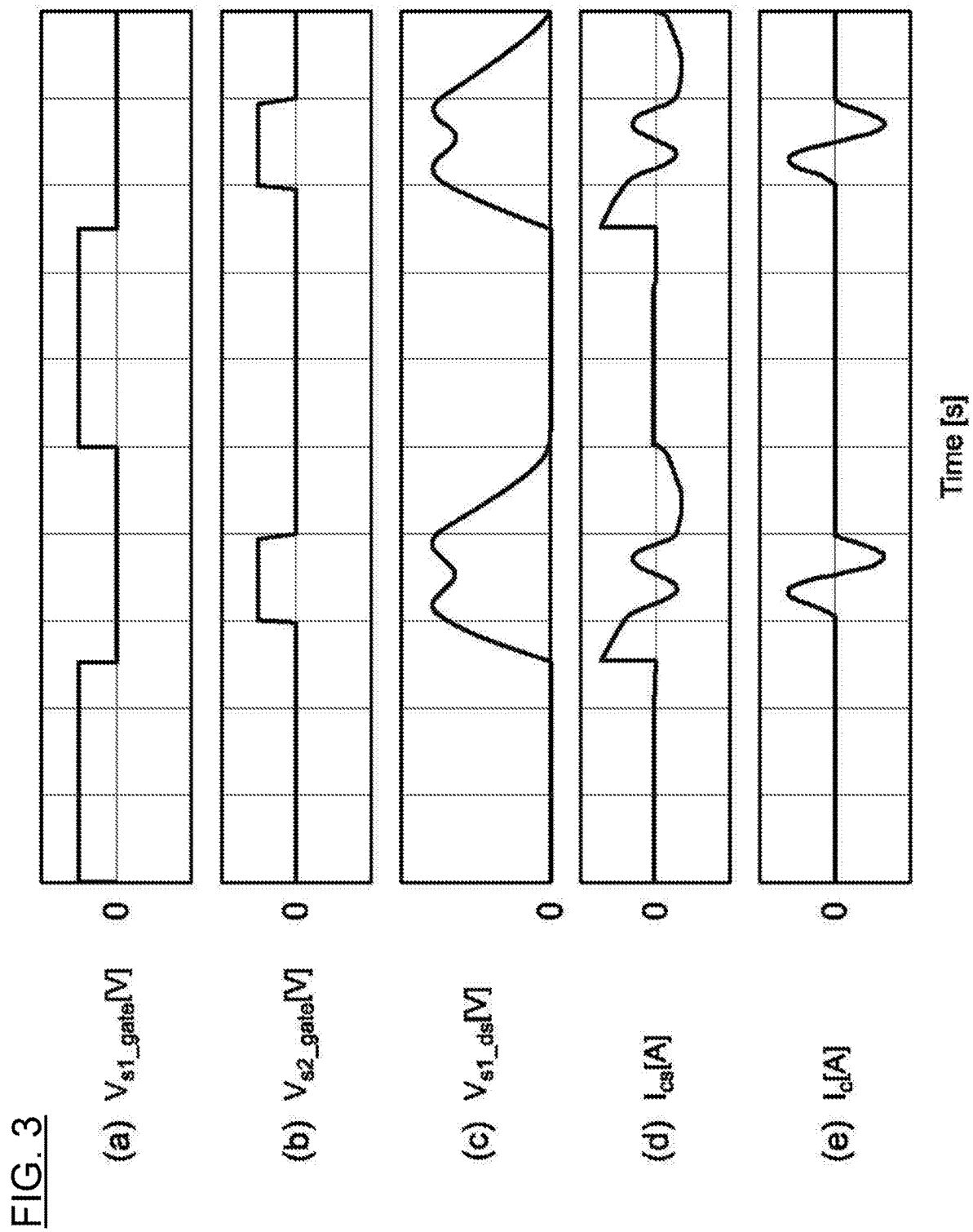
FIG. 3 is an exemplary operation of the resonance type power converter according to the first embodiment.

Next, with reference to FIGS. 1 and 3, the operation of the resonance type power converter according to the present embodiment will be described. FIG. 3 is an exemplary operation of the resonance type power converter according to the present embodiment. FIG. 3 (a) shows the control signal to the first switching element $S_1$ and corresponds to the upper plot of FIG. 2. FIG. 3 (b) shows the control signal to the second switching element $S_2$ and corresponds to the lower graph of FIG. 2. FIG. 3(c) shows the voltage $V_{s1\_ds}$ applied across the drain terminal and the source terminal of the first switching element $S_1$, and FIG. 3(d) shows the current $I_{cs}$ flowing into the shunt capacitor $C_s$. FIG. 3(d) shows the current $I_c$ flowing into the shunt circuit 3. The operation of the resonance type power converter will be described in the order of the time series shown in FIG. 3.

The operation of the resonance type power converter from the turn-off of the first switching element $S_1$ to the turn-on of the second switching element $S_2$ will be described. As shown in FIGS. 3(b), (d), (e), when the first switching element $S_1$ is turned off by the controller 4, the voltage $V_{s1\_ds}$ rises from the zero voltage and the current Is rapidly rises from the zero current. This indicates that when the first switching element $S_1$ is turned off, the charging of the shunt capacitor $C_s$ begins, and the voltage applied across both terminals of the first switching element $S_1$ connected in parallel to the shunt capacitor $C_s$ begins to rise. Once the first switching element $S_1$ is off, a current corresponding the capacitance value continues to flow into the shunt capacitor $C_s$ until the shunt capacitor $C_s$ is fully charged. Thus, the voltage $V_{s1\_ds}$ increases until the shunt capacitor $C_s$ is fully charged.

Next, the operation of the resonance type power converter when the second switching element $S_2$ is turned on will be described. As shown in FIGS. 3(b), (d), (e), when the second switching element $S_2$ is turned on by the controller 4 with the first switching element $S_1$ off, the current $I_c$ rises from zero current and the current $I_{cs}$ rapidly rises. This indicates that, as shown in FIG. 1, by turning on the second switching element $S_2$, the second resonance circuit conducts, and the current shunted from the ICs (hereafter simply referred to as shunt current) begins to flow into the capacitor $C_1$. The current flow into the shunt circuit 3 significantly reduces the current $I_{cs}$ flowing into the shunt capacitor $C_s$.

Next, the operation of the resonance type power converter during the turn-on period of the second switching element $S_2$ will be described. As shown in FIG. 3(c), the rising of the voltage $V_{s1\_ds}$ is suppressed. This indicates that during the turn-on periods of the second switching element $S_2$, the voltage applied across both terminals of the shunt capacitor $C_s$ is suppressed because the current planned to flow into the shunt capacitor $C_s$ is shunted. As shown in FIG. 3(e), the current $I_c$ is a current represented by a sine wave. In this embodiment, as shown in FIG. 1, the shunt circuit 3 includes the second resonance circuit. Therefore, the second resonance circuit resonates during the turn-on of the second switching element $S_2$. The resonant characteristics of the second resonance circuit will be described later.

Next, the operation of the resonance type power converter from the turn-off of the switching element $S_2$ to the turn-on of the switching element $S_1$ will be described. As shown in FIG. 3(e), when the second switching element $S_2$ is turned off, the current $I_c$ indicates a zero current. This indicates that the second switching element $S_2$ is turned off and no current flows into the shunt circuit 3. Further, as shown in FIGS. 3 (c), (d), the voltage $V_{s1\_ds}$ shows a shape such that toward the zero voltage along the sine wave, and the current ICs shows a negative current. During the turn-on period of the second switching element $S_2$, resonance occurred by the coil $L_0$ and the capacitor $C_0$ causes to start discharging at the shunt capacitor $C_s$. Thus, in a period from the time the second switching element $S_2$ is turned off to the time the first switching element $S_1$ is turned on, the shunt capacitor $C_s$ discharges, and the voltage applied across both terminals of the first switching element $S_1$ decreases toward zero voltage.

As described above, in the resonance type power converter according to the present embodiment, by controlling the second switching element $S_2$ during turn-off period of the first switching element $S_1$, the current flowing into the shunt capacitor $C_s$ can be divided to suppress the voltage applied across both terminals of the first switching element $S_1$. As a result, the peak voltage value can be reduced, and the load on the first switching element $S_1$ can be reduced.

Next, the resonant characteristics of the second resonance circuit comprising the shunt circuit 3 will be described. The controller 4 sets turn-on period $T_{s2\_on}$ of the second switching element $S_2$ for turn-off period $T_{s1\_on}$ of the first switching element $S_1$ to satisfy Equation (1) below.

[Number 1]

$$T_{s2\_on} < T_{s1\_on} \tag{1}$$

Further, the controller 4, in relation to the resonance frequency $f_{s1}$ defined by the coil L and the capacitor $C_1$, to satisfy Equation (2) below, sets the turn-on period $T_{s2\_on}$ of the second switching element $S_2$.

[Equation 2]

$$T_{s2\_on} = N \times T_{s1} = D_{s2} \times T_{s1} \tag{2}$$

[Equation 3]

$$T_{s1} = \frac{1}{f_{s1}} = 2\pi\sqrt{LC} \tag{3}$$

However, $T_{s2\_on}$ is the turn-on period of the second switching element $S_2$, N is a real number, $T_{s1}$, as shown in Equation (3), the reciprocal of the resonance frequency $f_{s1}$ defined by the coil L and the capacitor $C_1$, $D_{s2}$ is a ratio (duty ratio) indicating the on-period of the second switching element $S_2$ per unit time.

In the present embodiment, the controller 4 sets the turn-on period $T_{s2\_on}$ of the second switching element $S_2$ so as to satisfy the above Equations (1) to (3). In other words, the controllers 4 control the duty ratio to the second switching element $S_2$. As a result, while a shunt current, which is a resonant current, can be periodically flown to the shunt circuit 3, and the shunt current can be flown to the shunt circuit 3 at a predetermined time within turn-off period of the first switching element $S_1$. In addition, during the turn-on of the first switching element $S_1$, no current flows into the shunt circuit 3, so that the shunt can be performed intermittently.

Figure 4:
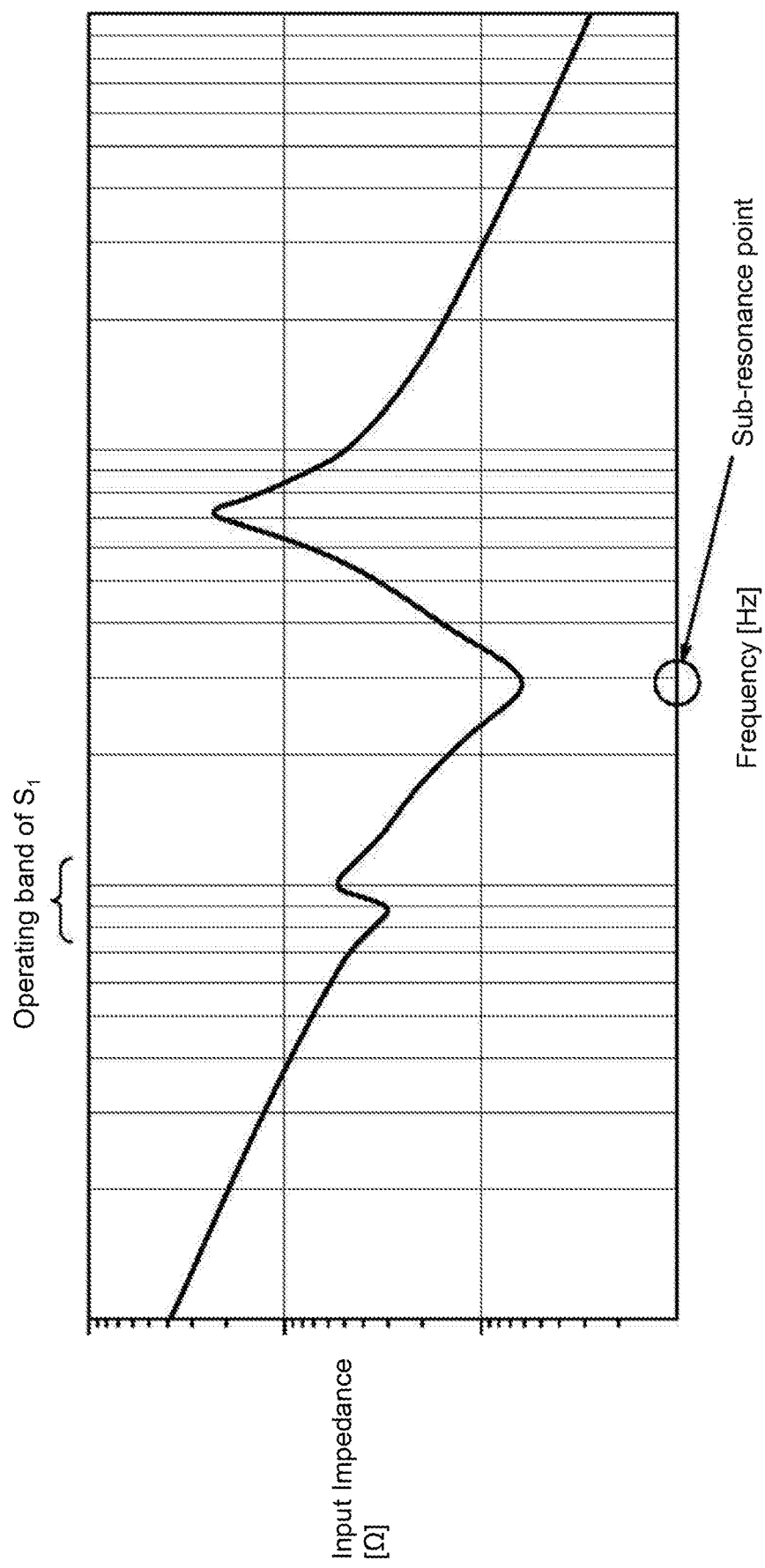
FIG. 4 is an input impedance characteristics of the resonance type power converter according to the first embodiment.

Next, with reference to FIG. 4, the input impedance characteristics of the resonance type power converter according to the present embodiment will be described. FIG. 4 is the input impedance characteristics of the resonance type power converter according to the present embodiment. FIG. 4 is the input impedance characteristic when viewing the load 2 side from the input voltage source 1 among the resonance type power converter shown in FIG. 1.

The operating band of the first switching element $S_1$ in FIG. 4 is a frequency band for executing a soft switching operation. The input impedance corresponding to this operating band is the impedance characteristic which becomes inductive for executing the soft switching operation. The controller 4 performs the first switching element $S_1$ turn-on control and turn-off control in the operating band of the first switching element $S_1$.

The sub-resonance point shown in FIG. 4 is the resonance frequency $f_{s1}$ defined by the coil L and the capacitor $C_1$. The controller 4 according to the present embodiment controls the second switching element $S_2$ so that the resonance frequency $f_{s1}$ is in a higher frequency band than the operating band of the first switching element $S_1$. Thus, while suppressing the influence on the soft switching operation performed by the first switching element $S_1$, it is possible to shunt the current flowing into the shunt capacitor $C_s$.

Next, the operational advantage of the resonance type power converter according to the present embodiment will be described with reference to a reference example and a comparative example.

Figure 5:
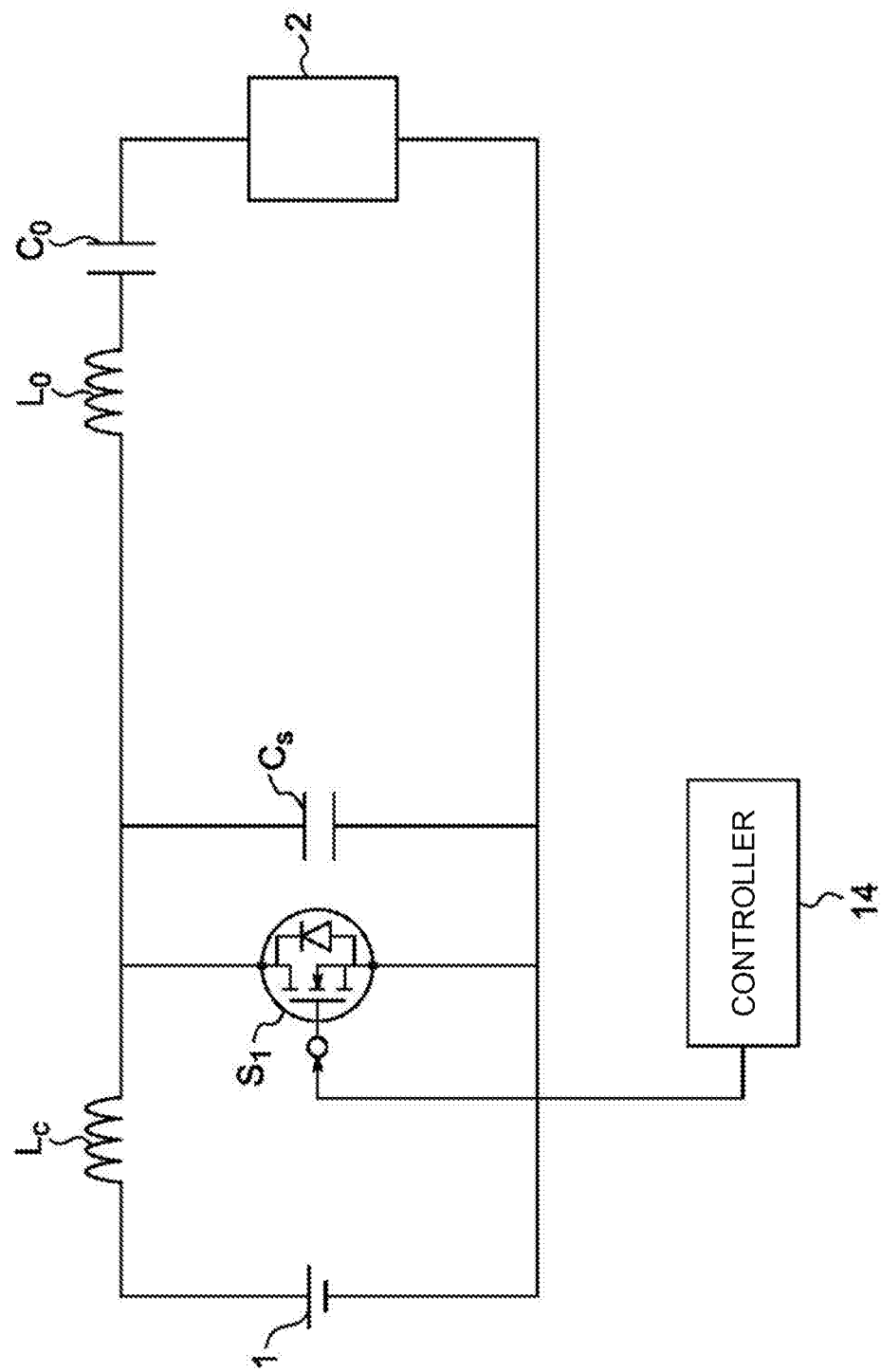
FIG. 5 is a configuration diagram of a power conversion system comprising a resonance type power converter according to a reference example.
Figure 6:
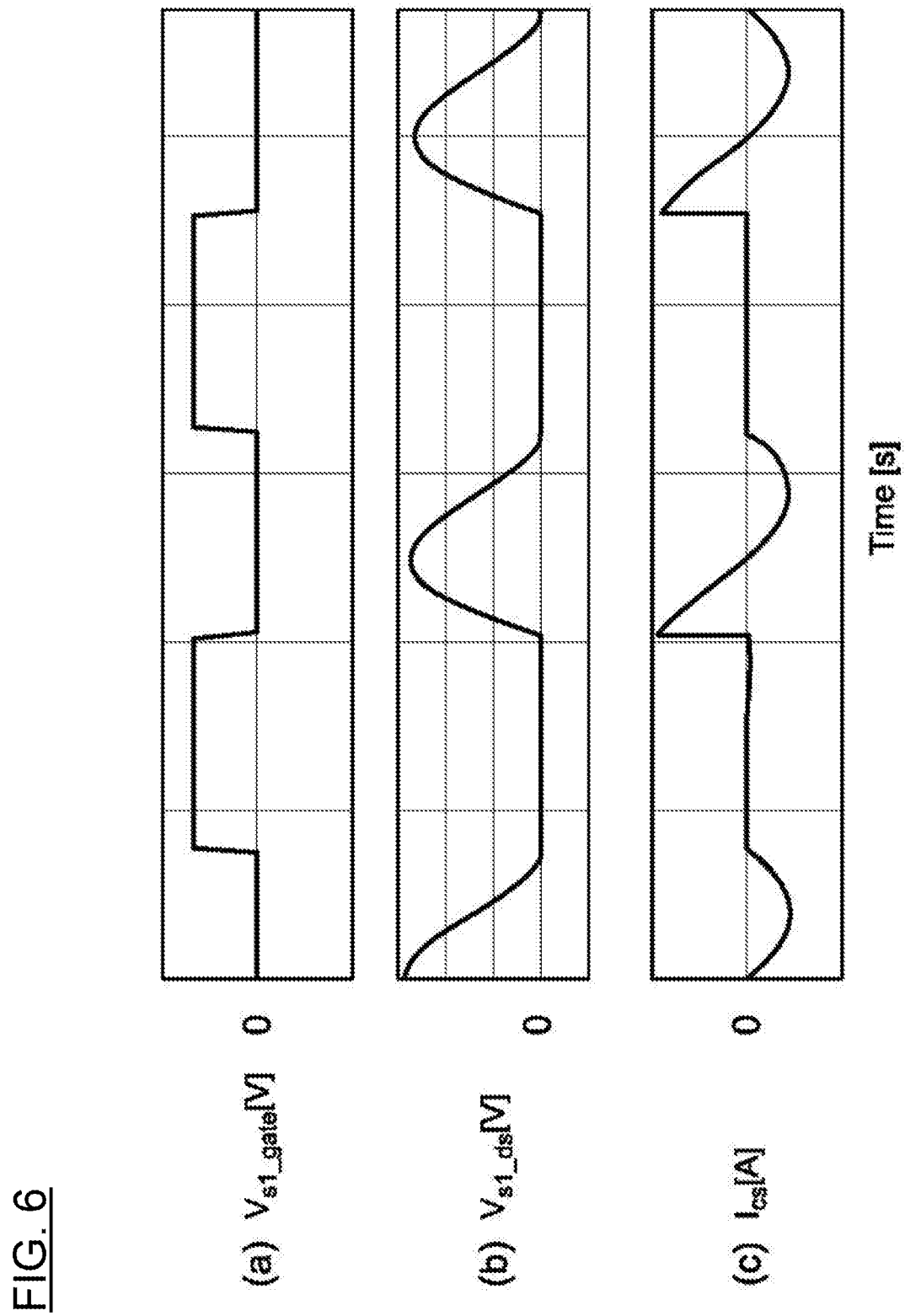
FIG. 6 is an exemplary operation of the resonance type power converter shown in FIG. 5.
Figure 7:
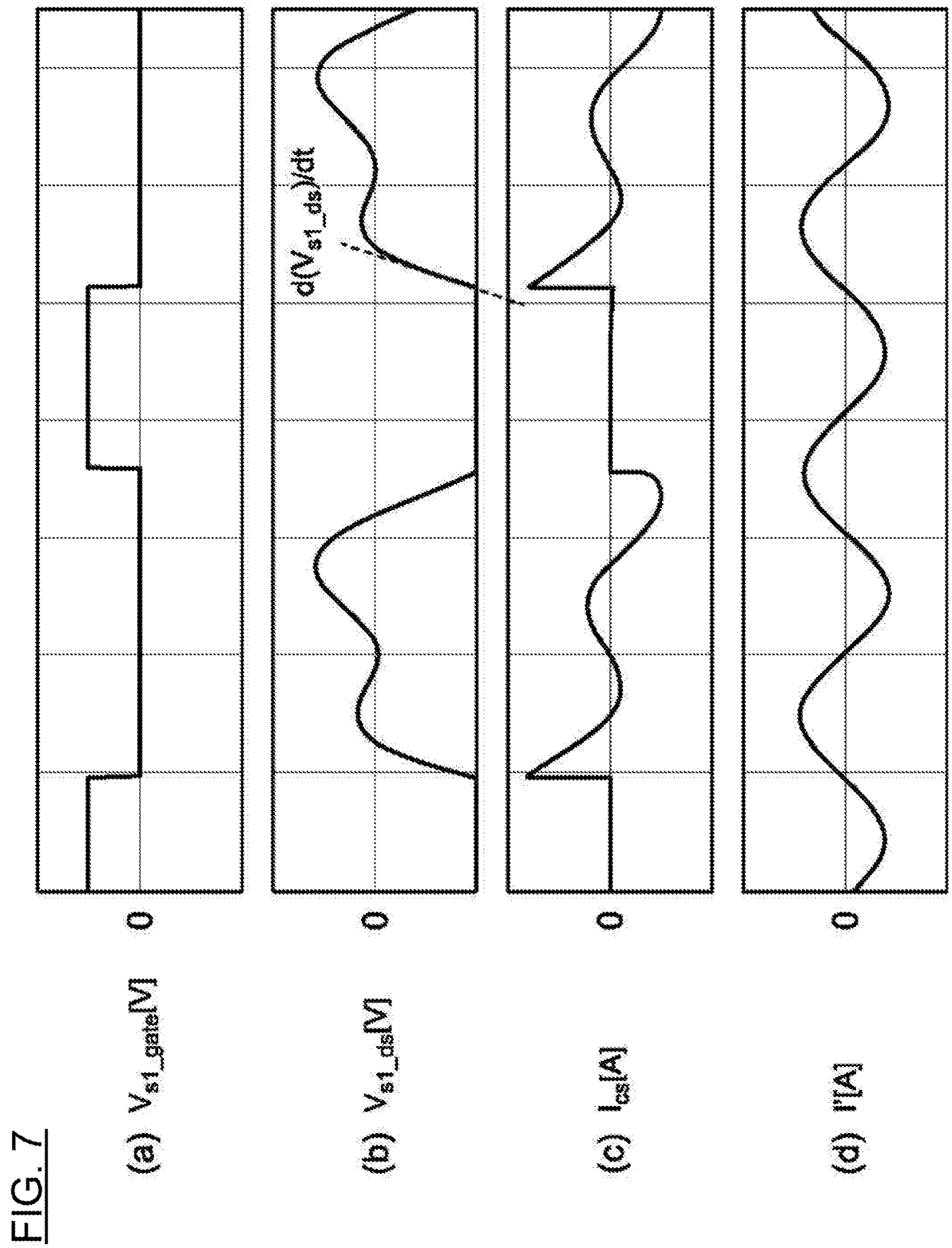
FIG. 7 is an exemplary operation of a resonance type power converter according to a comparative example.

FIG. 5 is a configuration diagram of a power conversion system comprising a resonance type power converter according to the reference example. FIG. 6 shows an example of the operation of the resonance type power converter shown in FIG. 5. Further, FIG. 7 shows an example of the operation of the resonance type power converter according to the comparative example. Since FIGS. 6(a), 6(b), and 6(c) correspond to FIGS. 3(a), 3(c), and 3(d), respectively, the above description will be referred to. In addition, since FIGS. 7(a), (b) and (c) correspond to FIGS. 3(a), (c) and (d), respectively, the above description will be referred to.

First, the resonance type power converter according to the reference example will be described. The resonance type power converter according to the reference embodiment has the same configuration and functions as the resonance type power converter according to the present embodiment except that the shunt circuit 3 is not provided and the controller 14 executes only the first switching element $S_1$. For convenience of explanation, the functions of the controller 14 are the same as those of the controller 4 shown in FIG. 1. In other words, the resonance type power converter according to the reference example is a so-called common class-E circuit.

As shown in FIG. 6, during turn-off period of the first switching element $S_1$, a voltage across both terminals of the first switching $S_1$ varies with time along a sine wave due to the charging and discharging of the shunt capacitor $C_s$. The voltage $V_{ds}$ applied across both terminals of the first switching element $S_1$ is shown in Equation (4) below.

[Equation 4]

$$V_{ds} = \frac{\int I_{cs} dt}{C_s} \quad (4)$$

However, $V_{ds}$ is the voltage applied across both terminals of the first switching element $S_1$, $I_{cs}$ is the current flowing into the shunt capacitor $C_s$, and $C_s$ is capacitance of the shunt capacitor $C_s$.

Here, considering how to reduce the voltage applied across both terminals of the first switching element $S_1$, from Equation (4), it may be changed the current $I_{cs}$ flowing into the shunt capacitor $C_s$ or capacitance value of the shunt capacitor $C_s$. However, since capacitance value of the shunt capacitor $C_s$ is a parameter for executing soft switching operation, it is difficult to change capacitance value when trying to secure soft switching operation. Therefore, if an attempt is made to reduce the voltage applied across both terminals of the first switching element $S_1$, the current $I_{cs}$ flowing into the shunt capacitor $C_s$ is reduced. In the described embodiment, by controlling the second switching element $S_2$, it is possible to reduce the current $I_{cs}$ flowing into the shunt capacitor $C_s$, thereby reducing the voltages applied across both terminals of the first switching element $S_1$.

Next, the resonance type power converter according to the comparative example shown in FIG. 7 will be described. The resonance type power converter according to the comparative example is an apparatus for reducing the current flowing into the shunt capacitor, thereby reducing the voltage applied across both terminals of the first switching element. The resonance type power converter according to the comparative example comprises a resonance circuit that always superimposes harmonics of an integral multiple of the operating frequency of the first switching element. The resonance type power converter according to the comparative example is a so-called E/F class circuit. FIG. 7 (d) shows the current I' flowing into the resonance circuit of the class E/F circuits.

As shown in FIG. 7, in the resonance type power converter according to the comparative embodiment, the current s flowing into the shunt capacitor is reduced by always shunting the current flowing into the shunt capacitor to the resonance circuit. As a result, the peak voltage applied across both terminals of the first switching element is reduced, while the rise speed of the voltage applied across both terminals of the first switching element is increased when the first switching element is turned off. In FIG. 7, the rising rate of the voltage applied across both terminals is indicated by the slope with respect to the voltage $V_{ds}$ when the first switching element is turned off. The faster the rise speed of the voltage applied across both terminals increases the switching loss that occurs when the first switching element is turned off.

On the other hand, the resonance type power converter according to the present embodiment comprises the first switching element $S_1$ connected in parallel to the input voltage source 1, the series resonance circuit configured with the coil $L_0$ and capacitor $C_0$ (first resonance circuit) connected to the first switching element $S_1$, the shunt circuit 3 including the second switching element $S_2$ and shunting a current flowing into the shunt capacitor $C_s$ in accordance with the operation of the second switching element $S_2$, the controller 4 for controlling the first switching element $S_1$ and the second switching element $S_2$. The controller 4 makes the current flowing into the shunt capacitor $C_s$ to shunt by controlling the second switching element $S_2$ during a predetermined period within turn-off period of the first switching element $S_1$. This allows current to flow into the shunt capacitor $C_s$ at the appropriate timing during turn-off period of the first switching element $S_1$, thereby reducing the switching losses that occur during soft switching operation.

Figure 8:
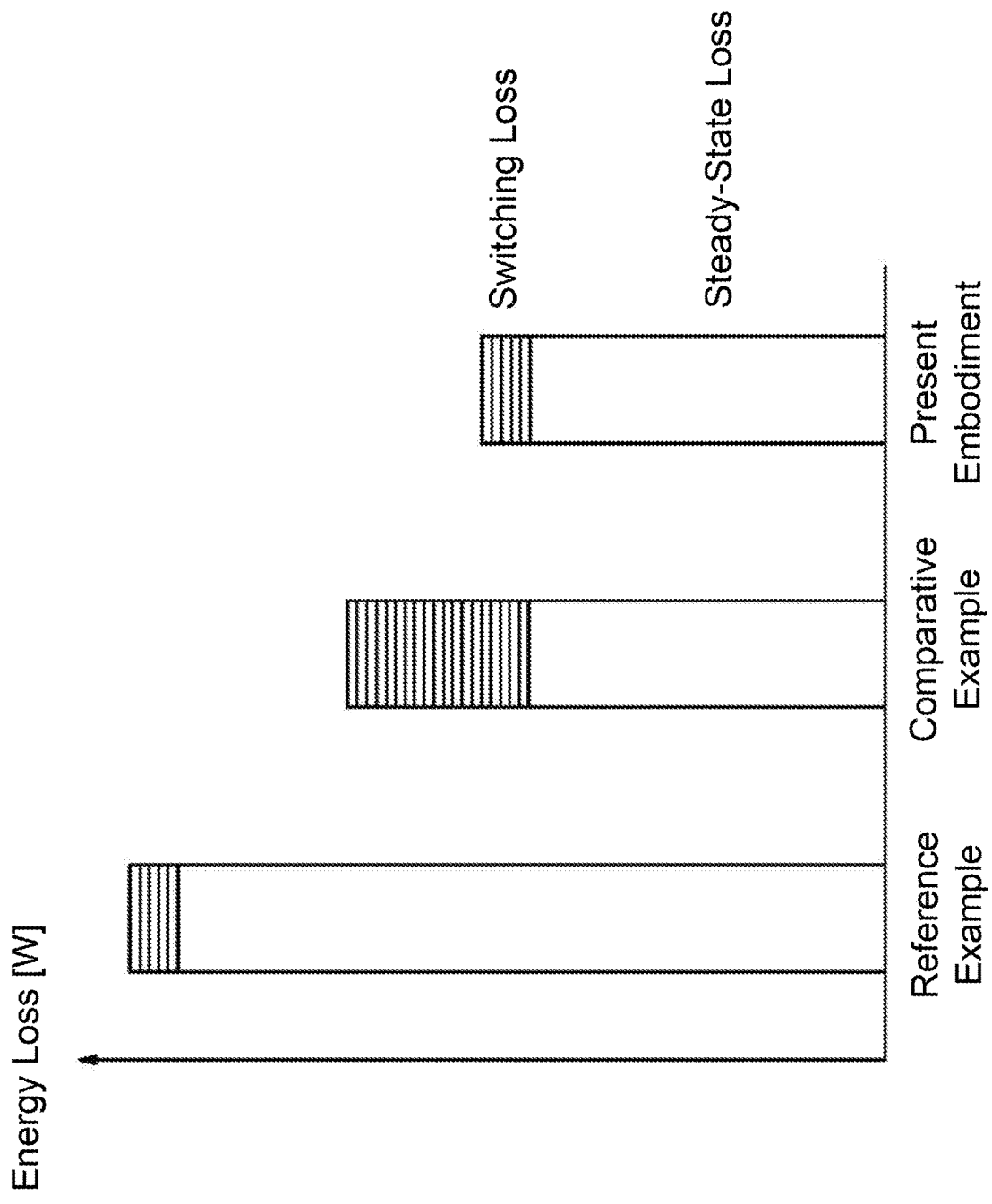
FIG. 8 is an example of a comparison result of the resonance type power converter according to the first embodiment, the resonance type power converter according to the reference example described with reference to FIGS. 5 and 6, and the resonance type power converter according to the comparative example described with reference to FIG. 7.

FIG. 8 is an example of a comparison result of the resonance type power converter according to the present embodiment, the resonance type power converter according to the reference example described with reference to FIGS. 5 and 6, and the resonance type power converter according to the comparative example described with reference to FIG. 7. The energy loss includes a steady-state loss that occurs regularly in the first switching element $S_1$ and a switching loss that occurs when the first switching element $S_1$ is turned on and off. As shown in FIG. 8, in the present embodiment, as compared with the resonance type power converter according to the reference example and the resonance type power converter according to the comparative example, it is possible to significantly reduce the switching loss.

Also, in the present embodiment, the controller 4 turn on the second switching element $S_2$ later than the first switching element $S_1$ is turned off. This makes it possible to suppress rise speed of the voltage applied across both terminals of the first switching element $S_1$ when first switching element $S_1$ is turned off, and consequently to reduce the switching losses that occur when the first switching element $S_1$ is turned off.

In addition, in the present embodiment, the controller 4 turns off the second switching element $S_2$ earlier than the first switching element $S_1$ is turned on. This allows the current flowing into the shunt capacitor $C_s$ to be shunted before the first switching element $S_1$ is turned on. As a result, the zero-voltage switching operation is ensured, and switching losses generated when the first switching element $S_1$ is turned on can be reduced.

In addition, in the present embodiment, the current flowing into the shunt capacitor $C_s$ is shunted by utilizing the resonant phenomena in the series resonance circuit (the second resonance circuit) configured with the coil L and the capacitor $C_1$ included in the shunt circuit 3. Thus, the shunt circuit 3 can be configured by the resonance circuit configured with the coil L and the capacitor $C_1$, and the shunt circuit 3 can be miniaturized.

In the present embodiment, the controller 4 controls the operating frequency of the second switching element $S_2$ so that the resonance frequency of the second resonance circuit is higher than the operating frequency of the first switching element $S_1$. This allows the resonance frequency of the second resonance circuit to be set outside the operating band of the first switching element $S_1$ so as to restrain the effect on the zero-voltage switching operation of the first switching element $S_1$. In other words, the switching loss can be further reduced without changing the characteristics of the class E circuit.

Further, in the present embodiment, the controller 4 controls the second switching element $S_2$ in accordance with the inverse of the resonance frequency of the second resonance circuit. Thus, the turn-on period of the second switching element $S_2$ can be set to a real multiple of the period indicated by the reciprocal of resonance frequency of the second resonance circuit. In other words, the shunt can be realized by controlling the duty ratio of the turn-on period to the second switching element $S_2$. As a result, even when variations occur in the inductances of the coil L and capacitance values of the capacitor $C_1$ configured with the shunt circuit 3 due to changes in the ambient temperatures, for example, the currents flowing into the shunt capacitors $C_s$ can be shunted with high accuracy.

The second resonance circuit according to the present embodiment is similar to the snubber circuit for restraining noises to the first switching element $S_1$, but since resonance frequency occurred by the second resonance circuit is set outside the operating band of the first switching element $S_1$, the operational advantage differs from the operational advantage by the snubber circuit.

Second Embodiment

Figure 9:
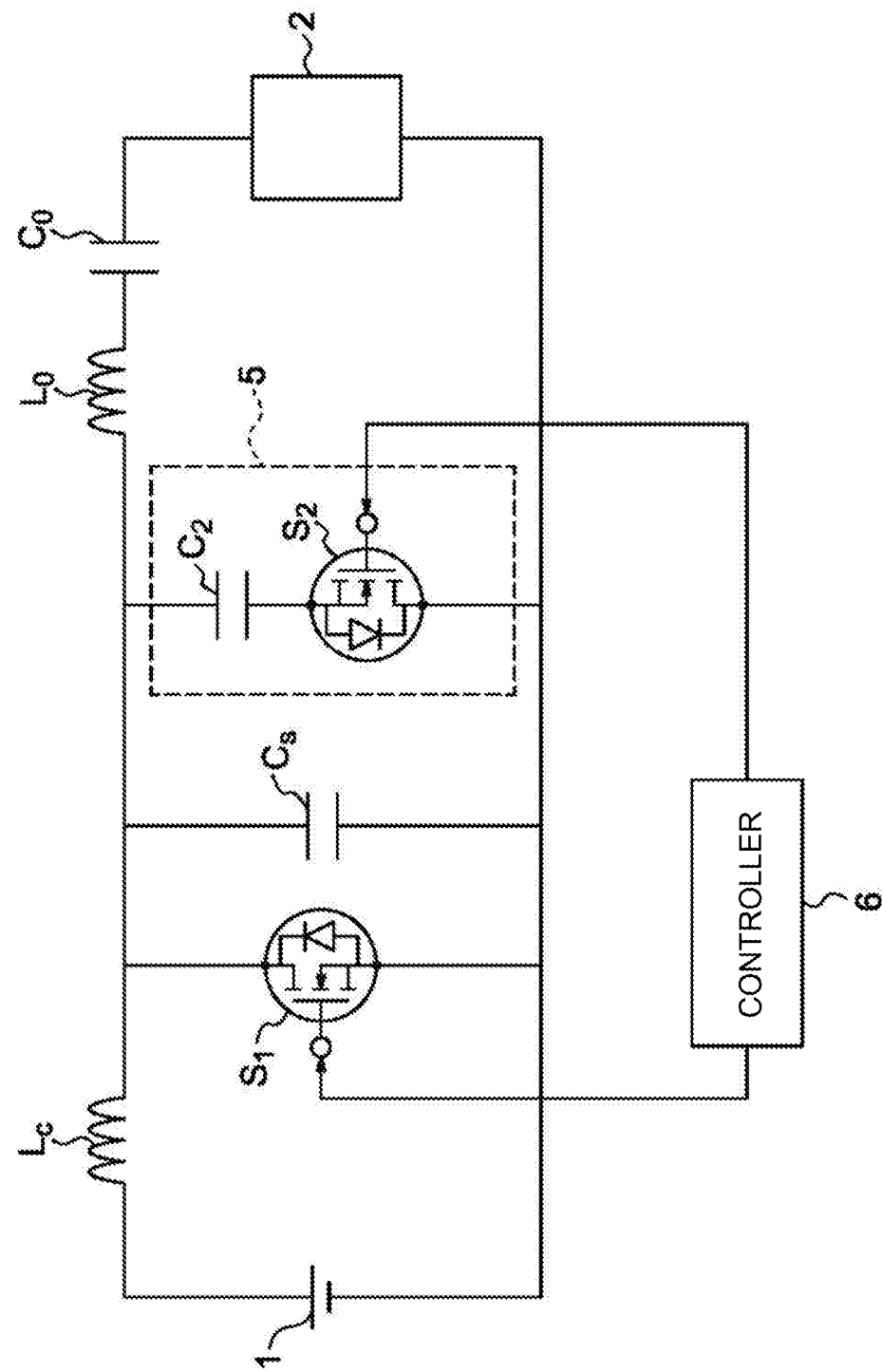
FIG. 9 is a configuration diagram of a power conversion system comprising a resonance type power converter according to a second embodiment.

Next, the resonance type power converter according to a second embodiment will be described. FIG. 9 is a diagram illustrating a configuration of a power conversion system comprising the resonance type power converter according to the second embodiment. The resonance type power converter according to the second embodiment has the same configuration and functions as the resonance type power converter according to the first embodiment except that the circuit configuration of the shunt circuit 5 and method for controlling the second switching element $S_2$ by the controller 6. For this reason, the descriptions used in the above-described embodiments will be referred to for configurations and functions like those of the resonance type power converter according to the first embodiment.

A shunt circuit 5 is connected in parallel to the shunt capacitor $C_s$ to shunt the current flowing into the shunt capacitor $C_s$. In this embodiment, the shunt circuit 5 is configured with a capacitor $C_2$ and a second switching element $S_2$ connected in serial to the capacitor $C_2$. One end of the capacitor $C_2$ is connected to the other end of the input coil $L_c$ and the other end of the capacitor $C_2$ is connected to a source terminal of the second switching element $S_2$. A drain terminal of the second switching element $S_2$ is connected to a low-potential side output terminal of the input voltage source 1.

Capacitance of the capacitor $C_2$ is set to a value greater than capacitance value of the shunt capacitor $C_s$. Thus, the current flowing into the shunt capacitor $C_s$ can be flowed into the capacitor $C_2$. The current flowing into the capacitor $C_2$ will be described later.

The second switching element $S_2$ has a diode inside the device. As shown in FIG. 9, an anode terminal of the diode is connected to the source terminal of the second switching element $S_2$, and a cathode terminal of the diode is connected to the drain terminal of the second switching element $S_2$. In other words, unlike the first embodiment, the anode terminal of the diode is disposed on the high-potential side of the input voltage source 1, the cathode terminal of the diode is disposed on the low-potential side of the input voltage source 1. Thus, when the voltage $V_{s1\_ds}$ across both terminals of the first switching element $S_1$ is higher than a voltage $V_{c2}$ across both terminals of the capacitor $C_2$, the current flowing into the shunt capacitor $C_s$ can be automatically flowed through the diode into the capacitor $C_2$. Incidentally, the shunt circuit may have any circuit configuration that limits the voltage $V_{s1\_ds}$ across both terminals of the first switching element $S_1$ and is not limited to the circuit configuration shown in FIG. 9.

By controlling the second switching element $S_2$, the controller 6 makes the current flowing into the shunt capacitor $C_s$ to shunt so as to cause the current to flow through shunt circuit 5.

The timing to turn on and off the second switching element $S_2$ and the turn-on period of the second switching element $S_2$ will be described with reference to FIG. 10.

Figure 10:
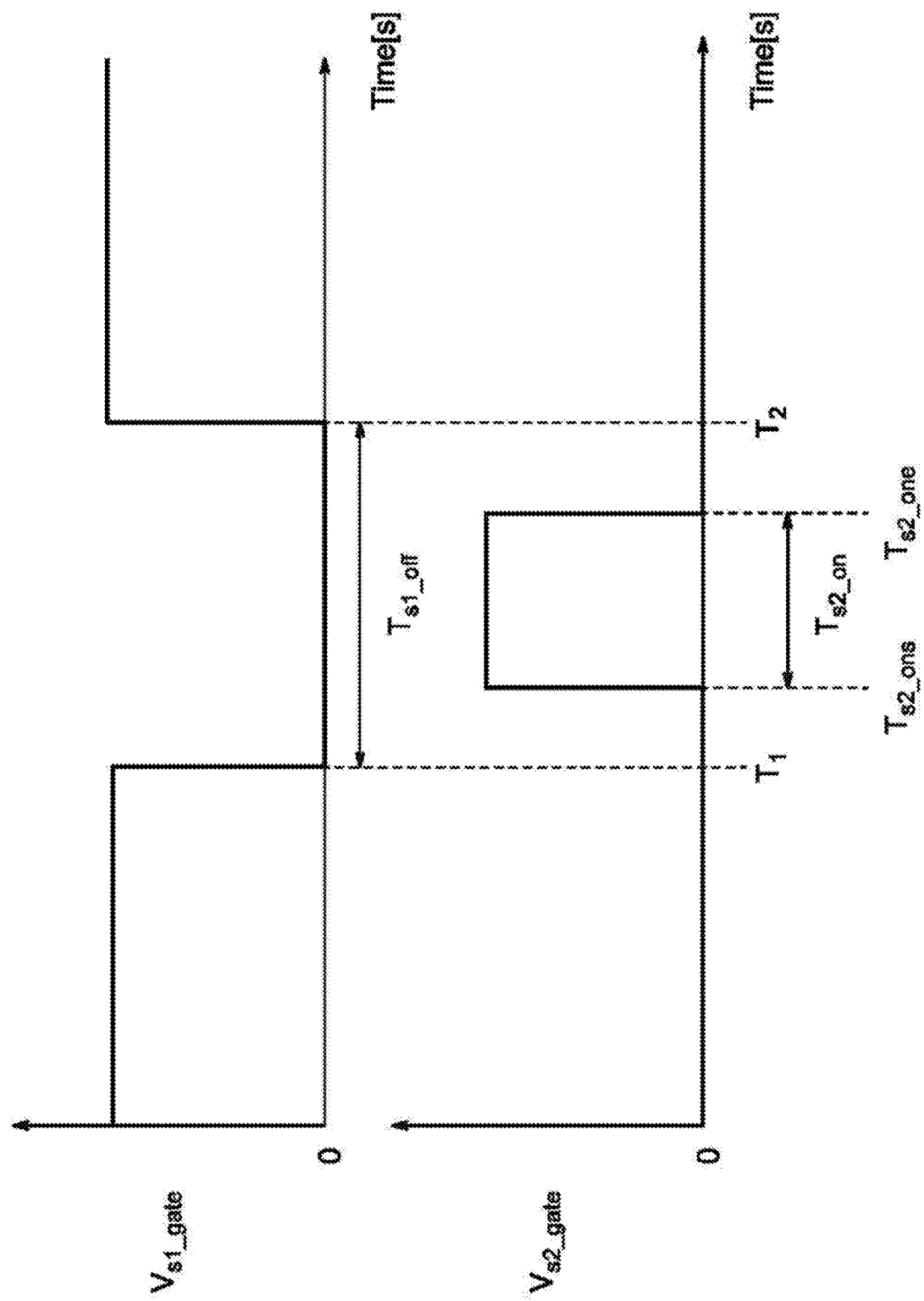
FIG. 10 is a diagram for explaining a control signal to a second switching element according to the second embodiment.

FIG. 10 is a diagram for explaining a control signal to the second switching element $S_2$. Since FIG. 10 corresponds to FIG. 2, the description of each reference numeral is appropriately used.

As shown in FIG. 10, the controller 6 controls the second switching element $S_2$ while a control signal to the first switching element $S_1$ is low-level. The controller 6 turns on the second switching element $S_2$ for a predetermined period within turn-off period of the first switching element $S_1$ and turns off the second switching element $S_2$ after a predetermined time. Specifically, the controller 6 turns on the second switching element $S_2$ later than the first switching element $S_1$ is turned off. When the second switching element $S_2$ is on, the controller 6 turns off the second switching element $S_2$ earlier than the first switching element $S_1$ is turned on.

Also, in the present embodiment, the controller 6 turns on the second switching element $S_2$ in accordance with the relationship between the voltage $V_{s1\_ds}$ across both terminals of the first switching element $S_1$ and the voltage $V_{c2}$ across both terminals of the capacitor $C_2$. Specifically, the controller 6 turns on the second switching element $S_2$ when the voltage $V_{s1\_ds}$ across both terminals of the first switching element $S_1$ is higher than the voltage $V_{c2}$ across both terminals of the capacitor $C_2$. As a configuration capable of detecting each voltage, a configuration in which a voltage sensor (not shown) for detecting the voltage $V_{s1\_ds}$ across both terminals of the first switching element $S_1$ and a voltage sensor (not shown) for detecting the voltage $V_{c2}$ across both terminals of the capacitor $C_2$ are provided and each voltage is input to the controller 6 can be exemplified.

In the example of FIG. 10, the controller 6 turns off the first switching element $S_1$ (time $T_1$), and when the voltage $V_{s1\_ds}$ across both terminals of the first switching $S_1$ is higher than the voltage $V_{c2}$ across terminals of the capacitor $C_2$, the controller 6 turns on the second switching element $S_2$ (time $T_{s2\_ons}$). The controller 6 then turns on the second switching element $S_2$ during the turn-on period $T_{s2\_on}$, and then turns off the second switching element $S_2$ (time $T_{s2\_one}$). When the control to the second switching element $S_2$ is completed, the controller 6 turns on the first switching element $S_1$ (time $T_2$).

Figure 11:
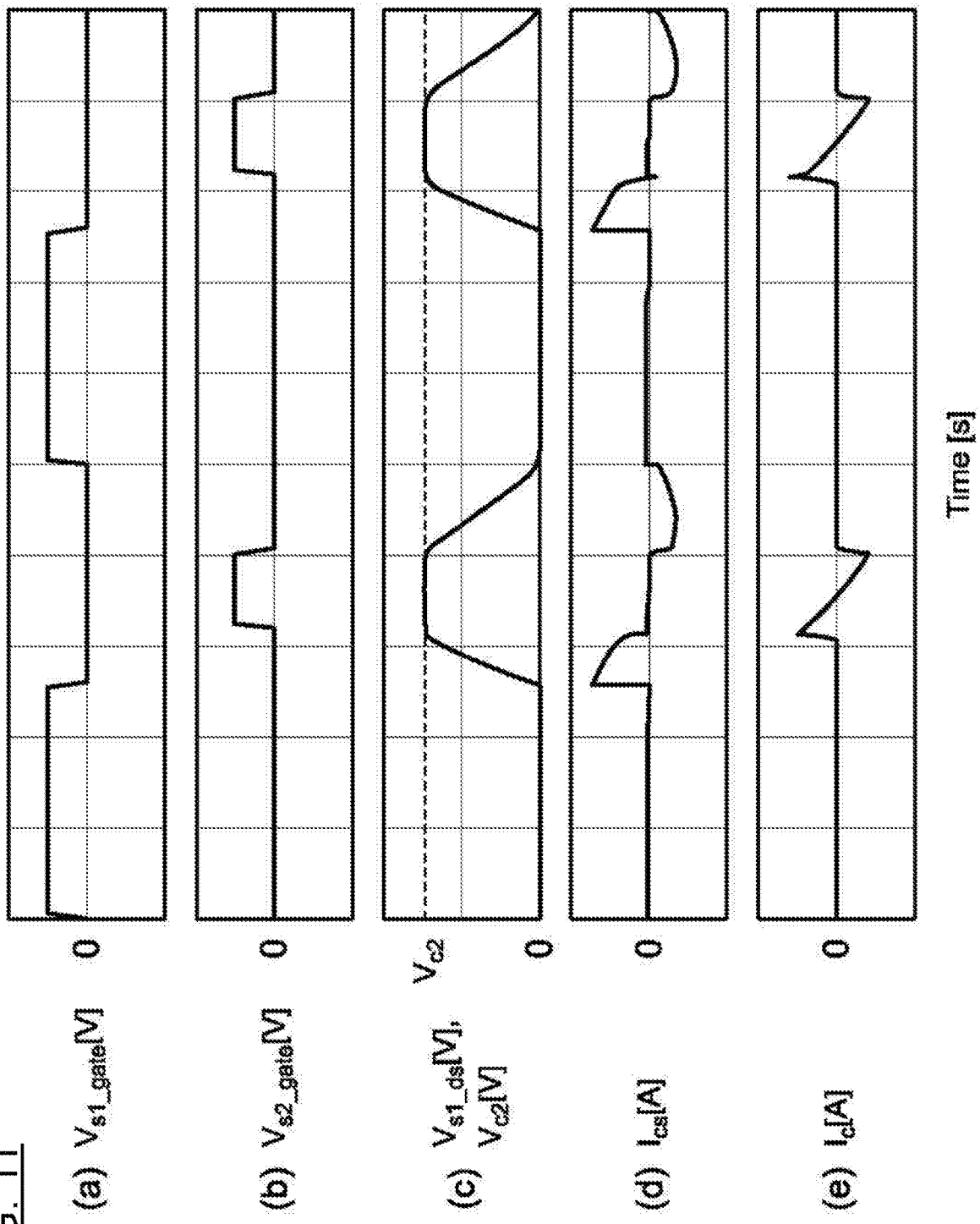
FIG. 11 is an exemplary operation of the resonance type power converter according to the second embodiment.

Next, with reference to FIGS. 9 and 11, the operation of the resonance type power converter according to the present embodiment. FIG. 11 is an exemplary operation of the resonance type power converter according to the present embodiment. FIGS. 11(*a*), (*b*), (*d*), and (*e*) correspond to FIGS. 3(*a*), (*b*), (*d*), and (*e*), and therefore, the description used in the above embodiment will be referred to. FIG. 11(*c*) shows the voltage $V_{s1\_ds}$ applied across the drain terminal and the source terminal of the first switching element $S_1$ and the voltage $V_{c2}$ across both terminals of the capacitor $C_2$. The operation of the resonance type power converter is described in the order of the time series shown in FIG. 11.

The operation of the resonance type power converter from the turn-off of the first switching element $S_1$ to the turn-on of the second switching element $S_2$ will be described. As shown in FIGS. 11(*b*), (*d*), (*e*), when the first switching element $S_1$ is turned off, charging to the shunt capacitor $C_s$ begins, and the voltages applied across both terminals of the first switching element $S_1$ connected in parallel to the shunt capacitor $C_s$ begins to rise.

Next, the operation of the resonance type power converter when the second switching element $S_2$ is turned on will be described. As shown in FIGS. 11(*b*), (*d*), (*e*), when the second switching element $S_2$ is turned on by the controller 6 with the first switching element $S_1$ is off, the current $I_c$ rises from the zero current and the current ICs becomes the zero current. This indicates that, as shown in FIG. 9, when the second switching element $S_2$ is turned on, the current flowing into the shunt capacitor $C_s$ begins to flow into the capacitor $C_2$. The voltage $V_{s1\_ds}$ is then limited by the voltage values of the voltage $V_{c2}$ applied across both terminals of the capacitor $C_2$.

Next, the operation of the resonance type power converter during the turn-on period of the second switching element $S_2$ will be described. As shown in FIG. 11(*c*), the voltage $V_{s1\_ds}$ is maintained by the voltage values of the voltage $V_{c2}$. This indicates that during the turn-on period of the second switching element $S_2$, the current planned to flow into the shunt capacitor $C_s$ is shunted, and the shunted current is flowing into a capacitor $C_2$ greater than capacitance value of the shunt capacitor $C_s$. FIG. 3E shows that the capacitor $C_2$ is charged and discharged.

Incidentally, since the operation from when the second switching element $S_2$ is turned off to when the first switching element $S_1$ is turned on is the same as the operation in the first embodiment, the description of the first embodiment is appropriately incorporated.

As described above, in the resonance type power converter according to the present embodiment, by controlling the second switching element $S_2$ during turn-off period of the first switching element $S_1$, the current flowing into the shunt capacitor $C_s$ can be shunted to limit the voltage applied across both terminals of the first switching element $S_1$. By reducing the peak voltage value, it is possible to reduce the load on the first switching element $S_1$.

Figure 12:
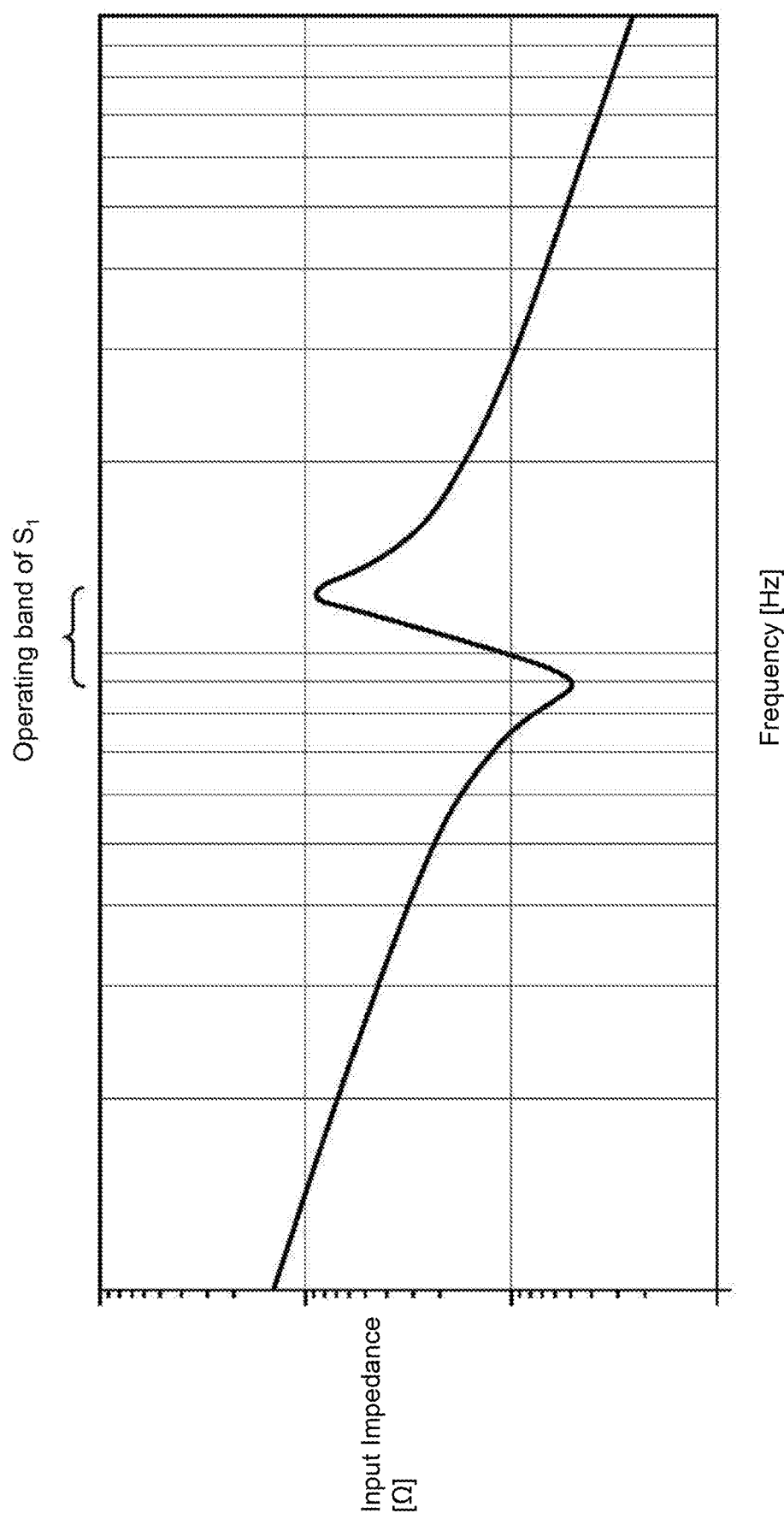
FIG. 12 is the input impedance characteristics of the resonance type power converter according to the second embodiment.

Next, with reference to FIG. 12, the input impedance characteristics of the resonance type power converter according to the present embodiment will be described. FIG. 12 is an input impedance characteristic of the resonance type power converter according to the present embodiment. FIG. 12 is the input impedance characteristic when viewing the load 2 side from the input voltage source 1 among the resonance type power converter shown in FIG. 9.

The operating band of the first switching element $S_1$ shown in FIG. 12 is a frequency band for executing a soft switching operation. In this embodiment, capacitance value of the capacitor $C_2$ is set greater than capacitance value of the shunt capacitor $C_s$. Thus, the impedance characteristics of capacitance of the capacitor $C_2$ are higher frequency bands than the operating band of the first switching element $S_1$. In FIG. 12, the sub-resonance point defined by the capacitor $C_2$ is not shown.

As described above, in the present embodiment, by accumulating charges in the capacitor $C_2$ included in shunt circuit 5, the current flowing into the shunt capacitor $C_s$ is shunted. Thus, it is possible to reduce the number of elements configured with the shunt circuit 5, as a result, the cost of the shunt circuit 5 can be reduced.

Also, in the present embodiment, the voltage applied across both terminals of the first switching element $S_1$ is limited by using a capacitor with a capacitance value greater than capacitance value of the shunt capacitor $C_s$ as the capacitor $C_2$. This allows the impedance property of capacitance of the capacitor $C_2$ to be set outside the operating band of the first switching element $S_1$, thereby restrain the effect on the zero-voltage switching operation of the first switching element $S_1$. In other words, the switching loss can be further reduced without changing the characteristics of the class E circuit.

In addition, in the present embodiment, the controller 6 turns on the second switching element $S_2$ when the voltage $V_{s1\_ds}$ across both terminals of the first switching element $S_1$ is greater than the voltage $V_{c2}$ across both terminals of the capacitor $C_2$. Thus, since the capacitor $C_2$ having a large capacitance is charged, the electric charge stored in the shunt capacitor $C_s$ can be extracted. As a result, it is possible to restrain a voltage rise across both terminals of the shunt capacitor $C_s$ and a voltage rise across both terminals of the first switching element $S_1$.

It should be appreciated that the embodiments explained heretofore are described to facilitate understanding of the present invention and are not described to limit the present invention. It is therefore intended that the elements disclosed in the above embodiments include all design changes and equivalents to fall within the technical scope of the present invention.

For example, in the embodiment described above, the configuration using the input voltage source 1 has been described as an example, but the present invention is not limited to this. For example, an input current source may be used instead of the input voltage source 1 and the input-coil $L_c$.

For example, in the first embodiment described above, the turn-on period $T_{s2\_on}$ of the second switching element $S_2$ has been described with reference to a configuration that is set to satisfy the equations (1) to (3), but the present invention is not limited to this. The turn-on period $T_{s2\_on}$ may be set to satisfy only Equation (1).

For example, in this specification, the resonance type power converter according to the present invention has been described exemplifying the inverter, but the present invention is not limited to this. In this specification, the first switching element according to the present invention has been described by exemplifying the first switching element $S_1$, but the present invention is not limited to this. In this specification, the second switching element according to the present invention has been described by exemplifying the second switching element $S_2$, but the present invention is not limited to this. In this specification, the first resonance circuit according to the present invention has been described by exemplifying the series resonance circuit configured with the coil $L_0$ and the capacitor $C_0$, but the present invention is not limited to this. In this specification, the second resonance circuit according to the present invention has been described by exemplifying the series resonance circuit configured with the coil L and the capacitor $C_1$, but the present invention is not limited to this. In this specification, the shunt circuit according to the present invention has been described by exemplifying the shunt circuit 3 and 5, but the present invention is not limited to this. In this specification, the first capacitor according to the present invention has been described by exemplifying the shunt capacitor $C_s$, but the present invention is not limited to this. In this specification, the second capacitor according to the present invention has been described by exemplifying the capacitor $C_2$, but the present invention is not limited to this.

EXPLANATIONS OF LETTERS OR NUMERALS

10 . . . Power conversion system
1 . . . Input voltage source
2 . . . Load
3 . . . Shunt circuit,
4 . . . Controller

The invention claimed is:
1. A method for controlling a resonance type power converter including
  a first switching element,
  a first capacitor connected in parallel to the first switching element,
  a first resonance circuit connected to the first switching element,
  a controller configured to control an operation of the first switching element, and
  a shunt circuit connected in parallel to the first capacitor and including a second switching element,
  the method comprising:
    converting and outputting, by the controller, power of a DC power supply by a switching operation of the first switching element in response to resonance of the first resonance circuit; and
    controlling, by the controller, the second switching element to shunt, to the shunt circuit, a current flowing into the first capacitor such that the second switching element is switched on and then switched off during a predetermined period within a turn-off period of the first switching element.
2. The method for controlling the resonance type power converter according to claim 1, comprising:
  turning on the second switching element later than the first switching element is turned off.
3. The method for controlling the resonance type power converter according to claim 1, comprising:
  turning off the second switching element earlier than the first switching element is turned on.
4. The method for controlling the resonance type power converter according to claim 1, comprising:
  shunting the current by resonating a second resonance circuit included in the shunt circuit.
5. The method for controlling the resonance type power converter according to claim 4, comprising:
  controlling the second switching element such that a resonance frequency of the second resonance circuit is higher than a switching frequency of the first switching element.
6. The method for controlling the resonance type power converter according to claim 4, comprising:
  setting the predetermined period for controlling the second switching element in accordance with an inverse of a resonance frequency of the second resonance circuit.
7. The method for controlling the resonance type power converter according to claim 1, comprising:
  shunting the current by storing electric charge in a second capacitor included in the shunt circuit.
8. The method of controlling the resonance type power converter according to claim 7, comprising:
  limiting a voltage across both terminals of the first switching element using a capacitance of the second capacitor that is greater than a capacitance of the first capacitor.
9. The method for controlling the resonance type power converter according to claim 7, comprising:
  turning on the second switching element when a voltage across both terminals of the second capacitor is higher than a voltage across both terminals of the first switching element.
10. A resonance type power converter comprising:
  a first switching element;
  a first capacitor connected in parallel to the first switching element;
  a first resonance circuit connected to the first switching element;
  a shunt circuit connected in parallel to the first capacitor and including a second switching element; and
  a controller configured to
    convert and output power of a DC power supply by a switching operation of the first switching element in response to resonance of the first resonance circuit, and
    control the second switching element to shunt, to the shunt circuit, a current flowing into the first capacitor such that the second switching element is switched on and then switched off during a predetermined period within a turn-off period of the first switching element.
11. The method for controlling the resonance type power converter according to claim 2, comprising:
  turning off the second switching element earlier than the first switching element is turned on.
12. The method for controlling the resonance type power converter according to claim 5, comprising:
  setting the predetermined period for controlling the second switching element in accordance with an inverse of a resonance frequency of the second resonance circuit.
13. The method for controlling the resonance type power converter according to claim 8, comprising:
  turning on the second switching element when a voltage across both terminals of the second capacitor is higher than a voltage across both terminals of the first switching element.

* * * * *